(12) United States Patent
Noh et al.

(10) Patent No.: US 7,956,342 B2
(45) Date of Patent: Jun. 7, 2011

(54) PHASE CHANGE MATERIAL FOR USE IN A PHASE CHANGE RANDOM ACCESS MEMORY, THE PHASE CHANGE MATERIAL HAVING UNIFORMLY DISTRIBUTED INSULATING IMPURITIES

(75) Inventors: Jin-seo Noh, Seoul (KR); Yoon-ho Khang, Yongin-si (KR); Sang-mock Lee, Yongin-si (KR); Dong-seok Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 209 days.

(21) Appl. No.: 11/498,796

(22) Filed: Aug. 4, 2006

(65) Prior Publication Data

US 2007/0029606 A1    Feb. 8, 2007

(30) Foreign Application Priority Data

Aug. 4, 2005   (KR) .................. 10-2005-0071482

(51) Int. Cl.
*H01L 29/02* (2006.01)
*H01L 29/12* (2006.01)
(52) U.S. Cl. ............. 257/2; 257/3; 257/4; 257/E29.002; 257/E29.068
(58) Field of Classification Search .................. 257/2–4, 257/296, E29.002, E29.068; 365/163
See application file for complete search history.

(56) References Cited

U.S. PATENT DOCUMENTS

| | | | |
|---|---|---|---|
| 6,800,504 B2 * | 10/2004 | Li et al. ..................... | 438/102 |
| 2004/0037179 A1 | 2/2004 | Lee | |
| 2004/0160817 A1 * | 8/2004 | Rinerson et al. ............ | 365/171 |
| 2005/0029502 A1 * | 2/2005 | Hudgens ...................... | 257/4 |
| 2005/0265072 A1 * | 12/2005 | Hart et al. .................. | 365/163 |
| 2006/0046509 A1 * | 3/2006 | Gwan-Hyeob ............... | 438/758 |
| 2006/0071244 A1 * | 4/2006 | Gutsche et al. ............. | 257/250 |
| 2007/0267620 A1 * | 11/2007 | Happ ............................ | 257/4 |
| 2008/0017842 A1 * | 1/2008 | Happ et al. .................. | 257/4 |

OTHER PUBLICATIONS

Chinese Office Action dated Aug. 14, 2009 and English translation for corresponding Chinese Application No. 200610121248.9.

* cited by examiner

*Primary Examiner* — Anh Phung
*Assistant Examiner* — Allison P Bernstein
(74) *Attorney, Agent, or Firm* — Harness, Dickey & Pierce, P.L.C.

(57) ABSTRACT

Insulating impurities may be uniformly distributed over an entire or partial region of the phase change material. The PRAM may include a phase change layer including the phase change material. The insulating impurity content of the phase change material may be 0.1 to 10% (inclusive) the volume of the phase change material. The insulating impurity content of the phase change material may be adjusted by controlling the power applied to a target including the insulating impurities.

14 Claims, 11 Drawing Sheets

PHASE CHANGE MATERIAL FOR USE IN A PHASE CHANGE RANDOM ACCESS MEMORY, THE PHASE CHANGE MATERIAL HAVING UNIFORMLY DISTRIBUTED INSULATING IMPURITIES

PRIORITY STATEMENT

This application claims the benefit of Korean Patent Application No. 10-2005-0071482, filed on Aug. 4, 2005, in the Korean Intellectual Property Office, the disclosure of which is incorporated herein in its entirety by reference.

BACKGROUND

1. Field

Example embodiments relate to a semiconductor memory device, for example, to a phase changing material, a phase change random access memory (PRAM) including the same, and methods of manufacturing and operating the same.

2. Description of the Related Art

In a PRAM, a phase change layer where data is stored may change between crystalline and amorphous depending on temperature. When the phase change layer is crystalline, a PRAM has a lower resistance. When the phase change layer is amorphous, the PRAM has a higher resistance. A PRAM is a nonvolatile memory device that writes/reads bit data on/from the phase change layer using the resistance difference of the phase state.

Conventional PRAMs may require a high reset current $I_{reset}$ to change the phase change layer into an amorphous state.

As a result of the development of semiconductor technology, it is not difficult to increase the integration level of a PRAM by reducing the size of transistors and storage nodes including the phase change layer.

However, when transistor size decreases, the maximum allowable current of the transistor also decreases. Therefore, it may be difficult to increase the integration level of the PRAM without the reduction of the reset current.

Because the conventional PRAM has a lower crystallization temperature, it may be more easily affected by its surrounding environment. This may degrade the reliability and/or retention properties of a conventional PRAM.

SUMMARY OF THE INVENTION

Example embodiments provide a phase changing material having a lower amorphization (or melting) temperature Tm and/or a higher crystallization temperature Tx.

Example embodiments provide a PRAM including the above phase changing material and may have a lower reset current and/or improved retention.

Example embodiments provide a method of operating the above PRAM.

Example embodiments provide a method of manufacturing the above PRAM.

According to example embodiments, there is provided a phase changing material including a first material whose crystallization temperature and amorphization temperature are different from each other and insulating impurities uniformly or substantially uniformly distributed over the first material.

In an example embodiment, the insulating impurities may be uniformly or substantially uniformly distributed over an entire region of the first material, or only over a partial region of the first material. The insulating impurities may be at least one of a $SiO_x$ (x=1~4), SiN, $Si_3N_4$, $TiO_x$ (x=1~4), AlO, and $Al_2O_3$. The insulating impurities may be 0.1 to 10% (inclusive) the volume of the first material. The insulating impurities may be located at vacancies or interstitial sites in the first material.

According to another example embodiment, there is provided a PRAM (phase change random access memory) including a switching device, a lower electrode connected to the switching device, a lower electrode contact layer formed on the lower electrode, a phase change layer formed on the lower electrode contact layer, a partial region of the lower surface of the phase change layer contacting an upper surface of the lower electrode contact layer; and an upper electrode formed on the phase change layer, wherein the phase change layer includes uniformly or substantially uniformly distributed insulating impurities.

In an example embodiment, the insulating impurities may be uniformly or substantially uniformly distributed over an entire region of the phase change layer.

In an example embodiment, the insulating impurities may be uniformly or substantially uniformly distributed only over a partial region of the phase change layer where a phase change occurs.

In an example embodiment, the insulating impurities may be at least one of a $SiO_x$ (x=1~4), SiN, $Si_3N_4$, $TiO_x$ (x=1~4), AlO, and $Al_2O_3$.

In an example embodiment, the insulating impurities may be 0.1 to 10% (inclusive) the volume of the phase change layer.

In an example embodiment, the lower electrode contact layer may be formed of TiN, TiAlN, or a material that has a negative Seebeck coefficient with a larger absolute value than TiN or TiAlN, a lower thermal conductivity than TiN or TiAlN, and/or the same level of electrical resistance as TiN or TiAlN.

In an example embodiment, the lower electrode contact layer may be one selected from the group consisting of a doped TiN layer, a TiAlN layer, an n-type SiGe layer, an n-type PbTe layer, an n-type polysilicon layer, and a cobalt silicon layer.

In an example embodiment, a spacer may be provided around the lower electrode contact layer.

In an example embodiment, the lower electrode contact layer may be filled in a portion of a contact hole and the phase change layer may be filled in a remaining portion of the contact hole.

According to another example embodiment, there is provided a PRAM (phase change random access memory) including a switching device, a lower electrode connected to the switching device, an interlayer insulating layer covering the switching device and the lower electrode, a first contact hole formed in the interlayer insulating layer to expose the lower electrode, a first lower electrode contact layer filling the first contact hole, a second lower electrode contact layer formed on the interlayer insulating layer to cover the first lower electrode contact layer, an insulating layer formed on the second lower electrode contact layer, the insulating layer including a second contact hole formed therein to expose the second lower electrode contact layer, a phase change layer formed on the upper surface of the insulating layer to fill the second contact hole, and an upper electrode formed on the phase change layer, wherein the phase change layer includes uniformly or substantially uniformly distributed insulating impurities.

In an example embodiment, the insulating impurities may be uniformly or substantially uniformly distributed over an entire region of the phase change layer.

According to another example embodiment, there is provided a method of operating a PRAM (phase change random access memory), the PRAM including a switching device, a lower electrode connected to the switching device, a lower electrode contact layer formed on the lower electrode, a phase change layer formed on the lower electrode contact layer, a partial region of the lower surface of the phase change layer contacting an upper surface of the lower electrode contact layer, and an upper electrode formed on the phase change layer, the phase change layer including uniformly or substantially uniformly distributed insulating impurities, the method including applying a reset current flowing through the phase change layer and the lower electrode contact layer to change a portion of the phase change layer contacting the lower electrode contact layer into an amorphous state.

In an example embodiment, the lower electrode contact layer may be filled in a portion of a contact hole and the phase change layer may be filled in a remaining portion of the contact hole.

In an example embodiment, after the reset current is applied to the PRAM, a set current flowing through the phase change layer and the lower electrode contact layer may be applied for a longer time than an applied time of the reset current.

In an example embodiment, the insulating impurities may be distributed over an entire region of the phase change layer.

In an example embodiment, the phase change layer may be T-shaped and the lower electrode contact layer may include a fist lower electrode contact layer connected to the switching device and a second lower electrode contact layer connecting the T-shaped phase change layer and the first lower electrode contact layer.

In an example embodiment, a side surface of the lower electrode contact layer may be covered by a spacer.

According to another example embodiment, there is provided a method of manufacturing a PRAM (phase change random access memory), the PRAM including a switching device formed at a substrate, a lower electrode connected to the switching device, a lower electrode contact layer formed on the lower electrode, a phase change layer formed on the lower electrode contact layer, a partial region of the lower surface of the phase change layer contacting an upper surface of the lower electrode contact layer, and an upper electrode formed on the phase change layer, the phase change layer including uniformly or substantially uniformly distributed insulating impurities, the method including forming the phase change layer including uniformly or substantially uniformly distributed insulating impurities by forming a mixed material on an upper surface of the resulting structure where the lower electrode contact layer is formed, the mixed material being formed by uniformly or substantially uniformly mixing component material of the phase change layer excluding the insulating impurities and material of the insulating impurities.

In an example embodiment, the component material of the phase change layer excluding the insulating impurities may be formed by simultaneously sputtering a target including a portion of the component material and another target including a remaining portion of the component material.

In an example embodiment, the material of insulating impurities may be formed by sputtering a target including the insulating impurities.

In an example embodiment, power may be applied to the target including the insulating impurities such that the insulating impurities content is 0.1 to 10% (inclusive) the volume of the phase change layer. In an example embodiment, the power applied to the target may be varied. In an example embodiment, the power applied to the target including the insulating impurities may be 30-500 W.

In an example embodiment, the insulating impurities may be at least one of a $SiO_x$ (x=1~4), SiN, $Si_3N_4$, $TiO_x$ (x=1~4), AlO, and $Al_2O_3$.

In an example embodiment, the phase change layer may be formed in a T-shape and the lower electrode contact layer may be formed to include a fist lower electrode contact layer connected to the switching device and a second lower electrode contact layer connecting the T-shaped phase change layer and the first lower electrode contact layer.

In an example embodiment, a side surface of the lower electrode contact layer may be covered by a spacer.

In an example embodiment, the lower electrode contact layer may be filled in a portion of a contact hole and the phase change layer may be filled in a remaining portion of the contact hole.

According to example embodiments, the amorphization temperature Tm of the PRAM decreases and/or the crystallization temperature Tx increases, due to the insulating impurities uniformly or substantially uniformly distributed over the phase change layer. Consequently, the reset current of the PRAM may decrease. Therefore, the size of the transistor may be reduced in accordance with the decreased reset current. Also, the retention characteristics of the PRAM may be improved, for example, due to the increase of the crystallization temperature.

BRIEF DESCRIPTION OF THE DRAWINGS

Example embodiments will be described in more detail with reference to the attached drawings in which.

DETAILED DESCRIPTION OF EXAMPLE EMBODIMENTS

Examples will now be described more fully with reference to the accompanying drawings. In the drawings, the thicknesses of layers and regions are exaggerated for clarity.

Example embodiments are described more fully hereinafter with reference to the accompanying drawings. Example embodiments are provided so that this disclosure will be thorough and complete, and will fully convey the scope of the appended claims to those skilled in the art.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element or component, from another element or component. Thus, a first element or component discussed below could be termed a second element or component without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternate implementations, the functions/acts noted in the blocks may occur in an order other than those set forth in the flowcharts. For example, two blocks shown in succession may in fact be executed substantially concurrently or the blocks may sometimes be executed in the reverse order, depending upon the functionality/acts involved.

Figure 1:
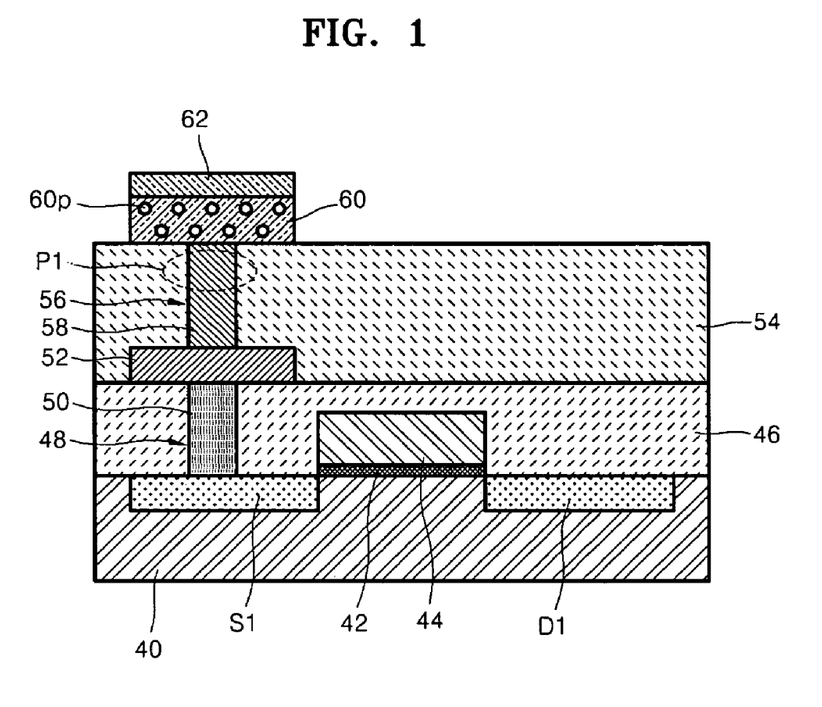
FIG. 1 is a sectional view of a PRAM according to an example embodiment.

FIG. 1 is a sectional view of a PRAM according to an example embodiment.

Referring to FIG. 1, the PRAM may include a substrate 40. First and second impurity regions S1 and D1 doped with predetermined conductive impurities (e.g., n-type impurities) are formed on the substrate 40, spaced apart from each other by a predetermined or given distance. The substrate 40 may be a p-type silicon substrate. The first and second impurity regions S1 and D1 may have various shapes. One of the first and second impurity regions S1 and D1 may be a source region and the other may be a drain region. A gate insulating layer 42 may be formed on the substrate 40 between the first and second impurity regions S1 and D1, and a gate 44 may be formed on the gate insulating layer 42. The substrate 40, the first and second impurity regions S1 and D1, and the gate 44 may constitute a field effect transistor. The field effect transistor may be replaced by a PN junction diode.

A first interlayer insulating layer 46 may be formed on the substrate 40 to cover the transistor. A contact hole 48 may be formed in the first interlayer insulating layer 46 to expose the first impurity region S1. In another example embodiment, the contact hole 48 may be formed through the first interlayer insulating layer 46 to expose the second impurity region D1, instead of the first impurity region S1. The contact hole 48 may be filled with a conductive plug 50. A lower electrode 52 may be formed on the first interlayer insulating layer 46 to cover the exposed upper surface of the conductive plug 50. The lower electrode 52 may also serve as a pad layer. A second interlayer insulating layer 54 may be formed on the first interlayer insulating layer 46 to cover the lower electrode 52, and a contact hole 56 may be formed through the second interlayer insulating layer 54 to expose the upper surface of the lower electrode 52. The second interlayer insulating layer 54 may be formed of the same material as the first interlayer insulating layer 46. The contact hole 56 may be filled with a lower electrode contact layer 58. The lower electrode contact layer 58 may be formed of a material that has a negative Seebeck coefficient with a larger absolute value than TiN or TiAlN, a lower thermal conductivity than TiN or TiAlN, and/or the same level of electrical resistance as TiN or TiAlN. A phase change layer 60 may be formed on the second interlayer insulating layer 54 to cover the exposed upper surface of the lower electrode contact layer 58. The phase change layer 60 may include a first material whose crystallization and amorphorization (or melting) temperatures are different from each other. The first material may include vacancies and/or interstitial sites. The phase change layer 60 may further include insulating impurities 60p, as well as the first material. The insulating impurities 60p may be uniformly or substantially uniformly distributed over the entire or partial region of the first material. The insulating impurities 60p may be placed at the vacancies and/or the interstitial sites. For example, the first material of the phase change layer 60 may be GST ($Ge_2Sb_2Te_5$). The insulating impurity 60p may be a particle, molecule, or atom. The insulating impurity 60p may be one selected from the group consisting of a silicon oxide ($SiO_x$; x=1~4), a silicon nitride (SiN, $Si_3N_4$), a titanium oxide ($TiO_x$, x=1~4), and an aluminium oxide (AlO, $Al_2O_3$). The silicon oxide ($SiO_x$) may be $SiO_2$ or $SiO_4$. The titanium oxide ($TiO_x$) may be $TiO_2$. The content of the insulating impurities 60p may be 0.1 to 10% (inclusive) the volume of the phase change layer 60, and contents may vary depending on the material. For example, when the insulating impurities 60p are $SiO_2$, their content may be about 6% in volume. An upper electrode 62 may be formed on the phase change layer 60. The upper electrode 62 may be a titanium nitride (TiN) electrode or a titanium aluminium nitride (TiAlN) electrode.

Figure 2:
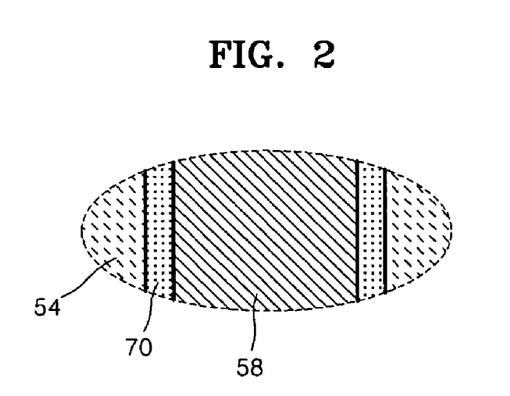
FIG. 2 is an enlarged sectional view illustrating a partial region P1 of a lower electrode contact layer in FIG. 1.

FIG. 2 is an enlarged sectional view illustrating the partial region P1 of the lower electrode contact layer 58 in FIG. 1.

As illustrated in FIG. 2, a spacer 70 may be formed between the lower electrode contact layer 58 and the second interlayer insulating layer 54. The spacer 70 may be provided to reduce the size of the contact hole 56. The spacer 70 may be formed of any material selected from the group consisting of SiN, $SiO_2$, $Al_2O_3$, and SiON, according to the material of the lower electrode contact layer 58.

Figure 3:
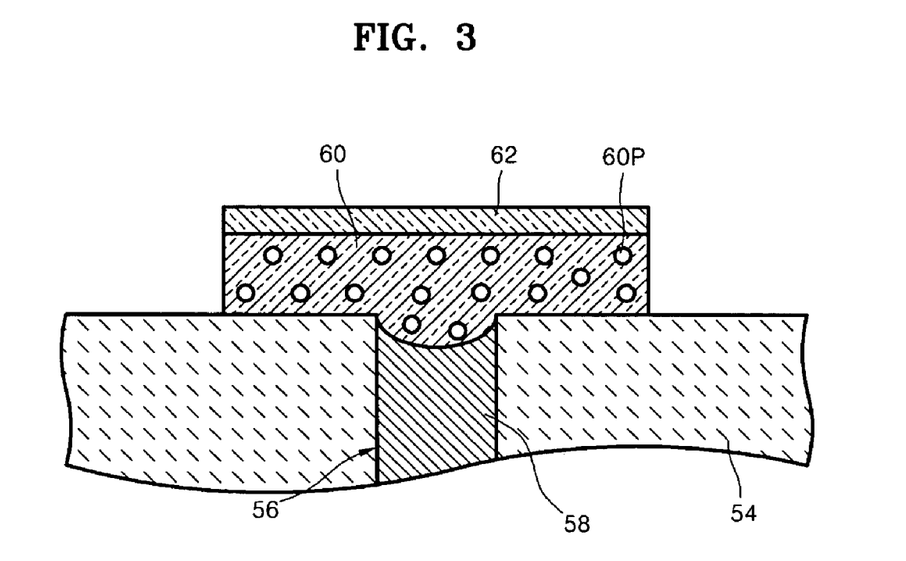
FIG. 3 is a sectional view illustrating a case where an upper portion of a contact hole is filled with a phase change layer extending to an upper portion of the lower electrode contact layer in FIG. 1.

FIG. 3 is a sectional view illustrating an example where an upper portion of the contact hole 56 is filled with the phase change layer 60 extending to an upper portion of the lower electrode contact layer 58.

As illustrated in FIG. 3, most of the contact hole 56 may be filled with the lower electrode contact layer 58, and the remaining portion may be filled with the phase change layer 60.

Figure 4:
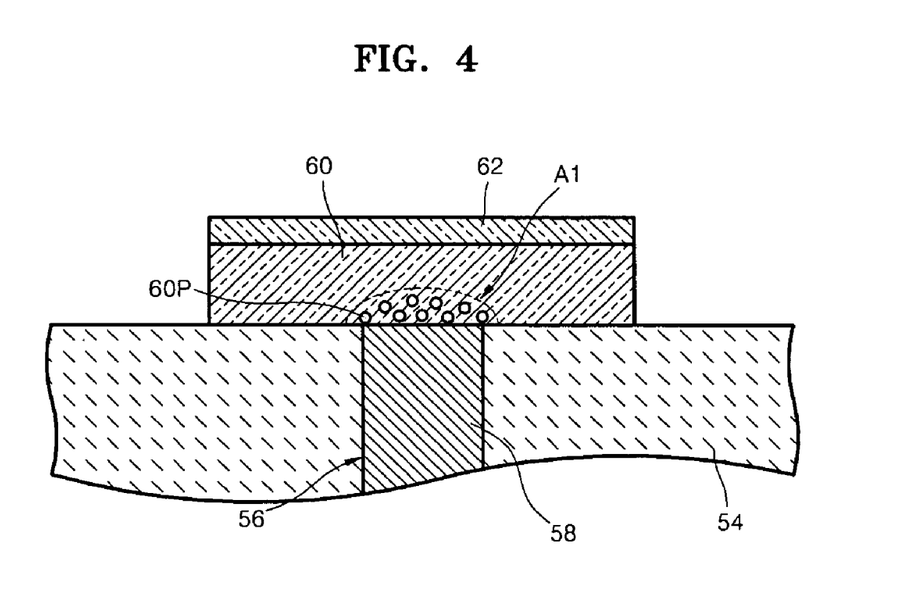
FIG. 4 is a sectional view of a PRAM according to another example embodiment.

FIG. 4 is a sectional view of a PRAM according to another example embodiment. In an example embodiment, the insulating impurities 60p may be uniformly or substantially uniformly distributed over a partial region of the phase change layer 60.

Referring to FIG. 4, the insulating impurities 60p are not distributed over the entire region of the phase change layer 60, but are uniformly or substantially uniformly distributed over only a partial region A1 of the phase change layer 60, wherein the partial region A1 contacts the lower electrode contact layer 58 and a phase change actually occurs in the partial region A1.

Tests were performed on PRAMs according to example embodiments to verify whether or not the insulating impurities 60p are uniformly or substantially uniformly distributed in the phase change layer 60 and the corresponding effects.

To verify where the insulating impurities 60p exist in the phase change layer 60, PRAMs were manufactured with a different content of insulating impurities 60p. In the test, a GST layer was used as the phase change layer 60 and $SiO_2$ was used as the insulating impurity 60p.

A phase change layer of an example PRAM of FIG. 1 was formed by a sputtering deposition process where 60-W power is applied to a $SiO_2$ target from which the insulating impurities 60p are emitted. A phase change layer of an example PRAM of FIG. 4 was formed by applying 100-W power to the $SiO_2$ target, and a phase change layer of another example PRAM was formed by applying 120-W power to the $SiO_2$ target.

FIGS. 5 through 12 are graphs illustrating the results of the above test.

Figure 5:
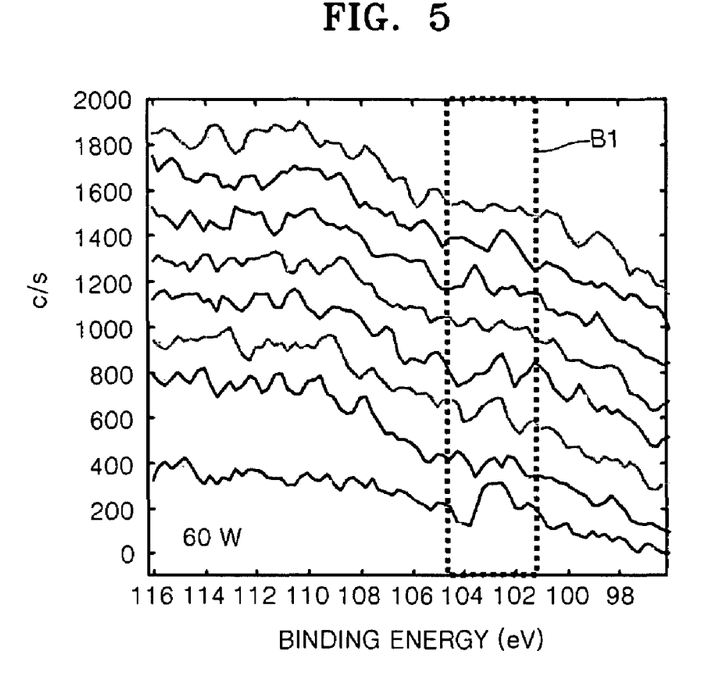
FIGS. 5 through 12 are graphs illustrating the results of a test performed for measuring the physical characteristics of the PRAM according to example embodiments.
Figure 6:
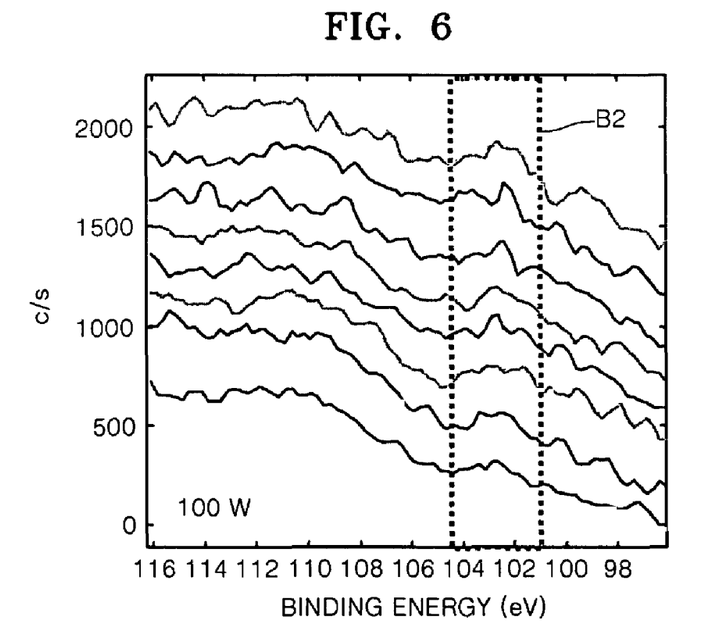
Figure 7:
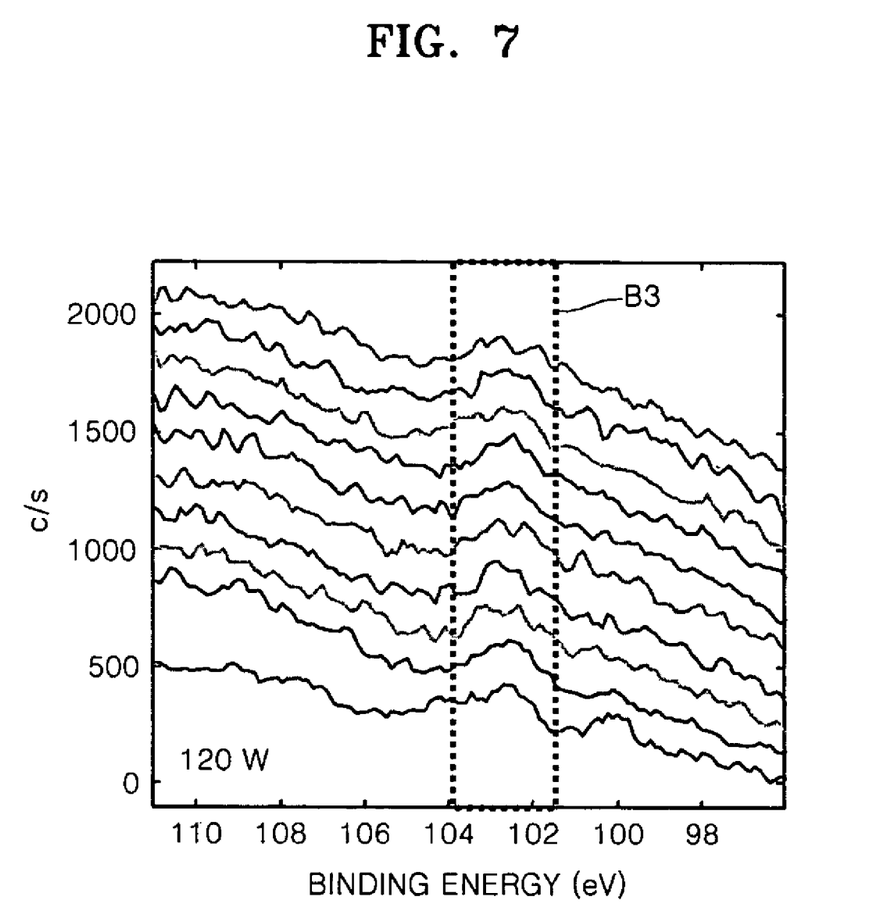

FIGS. 5 through 7 illustrate the X-ray photoelectron spectroscopy (XPS) test results for the phase change layer of the first, second and third test PRAMs, respectively.

In FIGS. 5 through 7, first through third dotted-line boxes B1, B2 and B3 represent the peak of $SiO_2$. As can be seen from the comparison of the boxes B1, B2 and B3, the peak of $SiO_2$ becomes clearer from the phase change layer of the first test PRAM to the phase change layer of the third test PRAM.

From this comparison result, it can be seen that $SiO_2$ exists as the insulating impurity in the phase change layers of the first through third test PRAMs, and also that the $SiO_2$ content in the phase change layer increases as the power applied to the $SiO_2$ target increases.

The relationship between the $SiO_2$ content of the phase change layer and the power applied to the $SiO_2$ target during the formation of the phase change layer can be seen from the Ellipsometry analysis results for the completed phase change layer.

Figure 8:
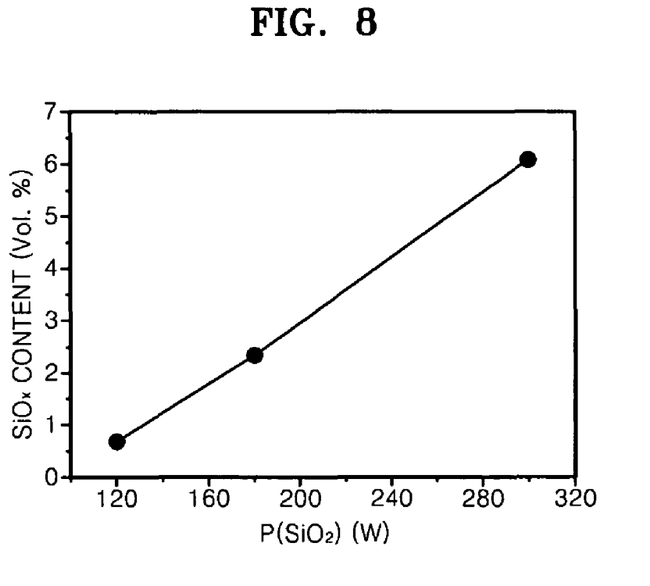

FIG. 8 illustrates the Ellipsometry analysis results for the phase change layers of the first through third test PRAMs.

As can be seen from FIG. 8, the $SiO_2$ content of the phase change layer increases in proportion to the power applied to the $SiO_2$ target.

Figure 9:
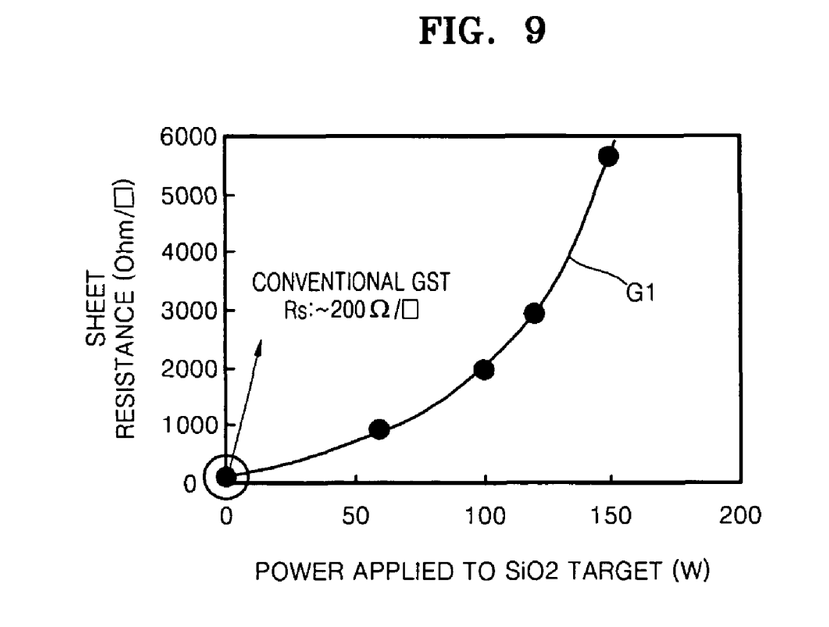

The change of the sheet resistance of the phase change layer in the first through third test PRAMs was also measured as a function of the power applied to the $SiO_2$ target, and the measurement results are illustrated in FIG. 9. In order to maintain the entire phase change layer of the first through third test PRAM in a crystalline state for the above measurement, the formed phase change layer was annealed at 300° C. for about 10 minutes immediately after the formation of the phase change layer during the manufacturing of the first and third test PRAMs. Accordingly, the result in FIG. 9 illustrates a change in the sheet resistance of the phase change layer that is entirely in the crystalline state.

Referring to FIG. 9 considering that the conventional GST layer has a sheet resistance Rs of 200Ω/□, it can bee seen that the sheet resistance of the phase change layer increases as the power applied to the $SiO_2$ target increases. As can be seen from the graph G1 in FIG. 9, the sheet resistance exponentially increases as the applied power increases.

As can be seen from FIG. 8, the $SiO_2$ content of the phase change layer increases as the applied power increases. Thus, it can be seen that the sheet resistance of the phase change layer exponentially increases as the $SiO_2$ content of the phase change layer increases.

As described above, the phase change layer of the PRAM according to example embodiments may have a higher sheet resistance than a phase change layer of the conventional PRAM. Therefore, even when the same reset current is supplied to the conventional phase change layer and the phase change layer according to example embodiments, the phase change layer according to example embodiments generates a higher Joule heat than the conventional phase change layer. This means that the phase change layer according to example embodiments requires a lower reset current than the conventional phase change layer to generate the same Joule heat.

The sheet resistance of the phase change layer increases exponentially increases with an increase in $SiO_2$ content of the phase change layer or the power applied to the $SiO_2$ target. When the $SiO_2$ content increases excessively, the sheet resistance may increase too much. In an example embodiment, the $SiO_2$ content of the phase change layer is maintained below 10% by volume.

Figure 10:
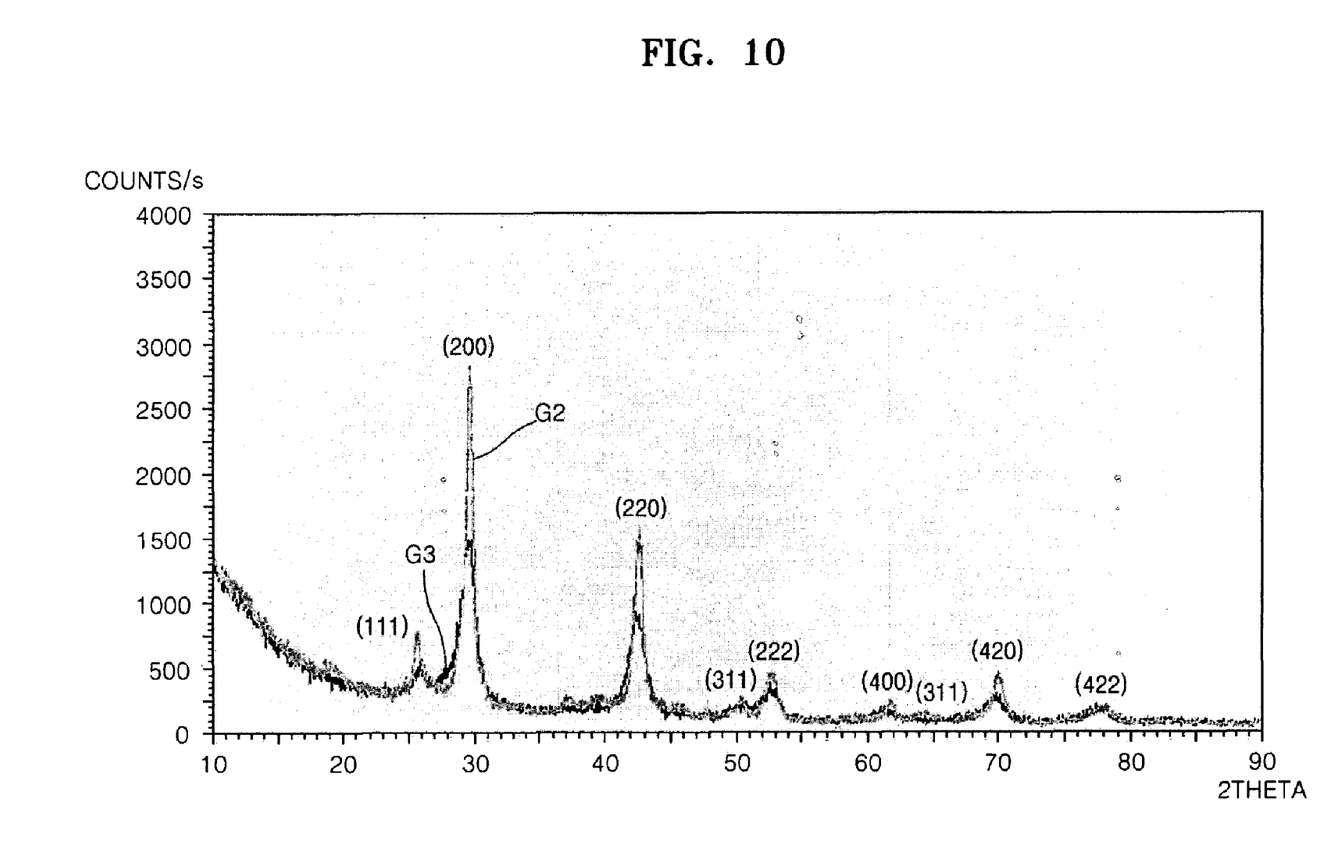

An X-ray diffraction analysis was also performed on phase change layers according to example embodiments of the third test PRAM and the conventional phase change layer not containing insulating impurities. The analysis results are illustrated in FIG. 10. In FIG. 10, the graph G2 relates to the phase change layer of the conventional PRAM and the graph G3 relates to the phase change layer of the third test PRAM.

As can be seen from the second and third graphs G2 and G3, like the conventional phase change layer, the phase change layer of the third test PRAM has a crystalline lattice structure of face-centered cubic (FCC). Also, in case of the phase change layer of the third test PRAM, it can be seen that the peaks have large full width at the half maximum in various crystalline directions, low amplitude, somewhat large width, and noisy peaks. Accordingly, it can be seen that the phase change layer of the third test PRAM has smaller crystalline particles and somewhat distorted lattices compared to the phase change layer of the conventional PRAM.

Figure 11:
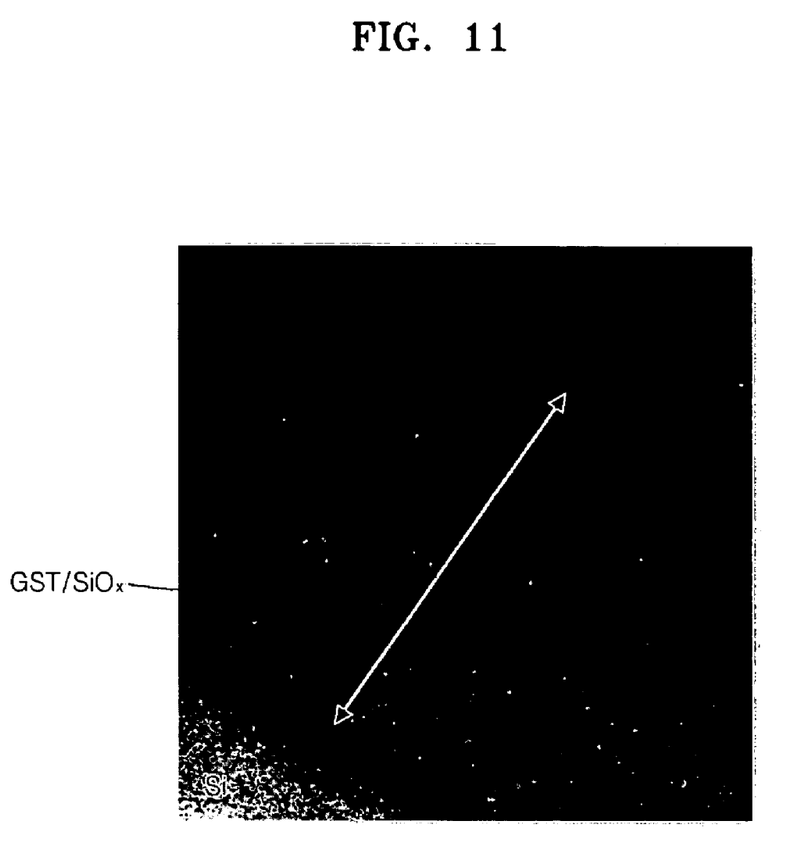

To observe the distribution of the insulating impurities in the phase change layer of a PRAM according to example embodiments a phase change layer was fabricated by applying 180-W power to the $SiO_2$ target and then measuring a silicon (Si) map for the fabricated phase change layer using the Gatan image filter (GIF). This measurement result is illustrated in FIG. 11. In FIG. 11, a black portion and a white portion correspond to GST and Si, respectively.

As can be seen from FIG. 11, silicon is uniformly distributed over the phase change layer 60 and particle or cluster type $SiO_x$ is not observed at the phase change layer 60.

Phase change temperatures (e.g., crystallization temperature and amorphorization temperature) of the phase change layer in PRAMs were measured according to the insulating impurity content of the phase change layer. The measured objects are first, second and third phase change layers that are respectively formed by applying 120-W power, 180-W power and 300-W power to the $SiO_2$ target during the co-sputtering process.

Figure 12:
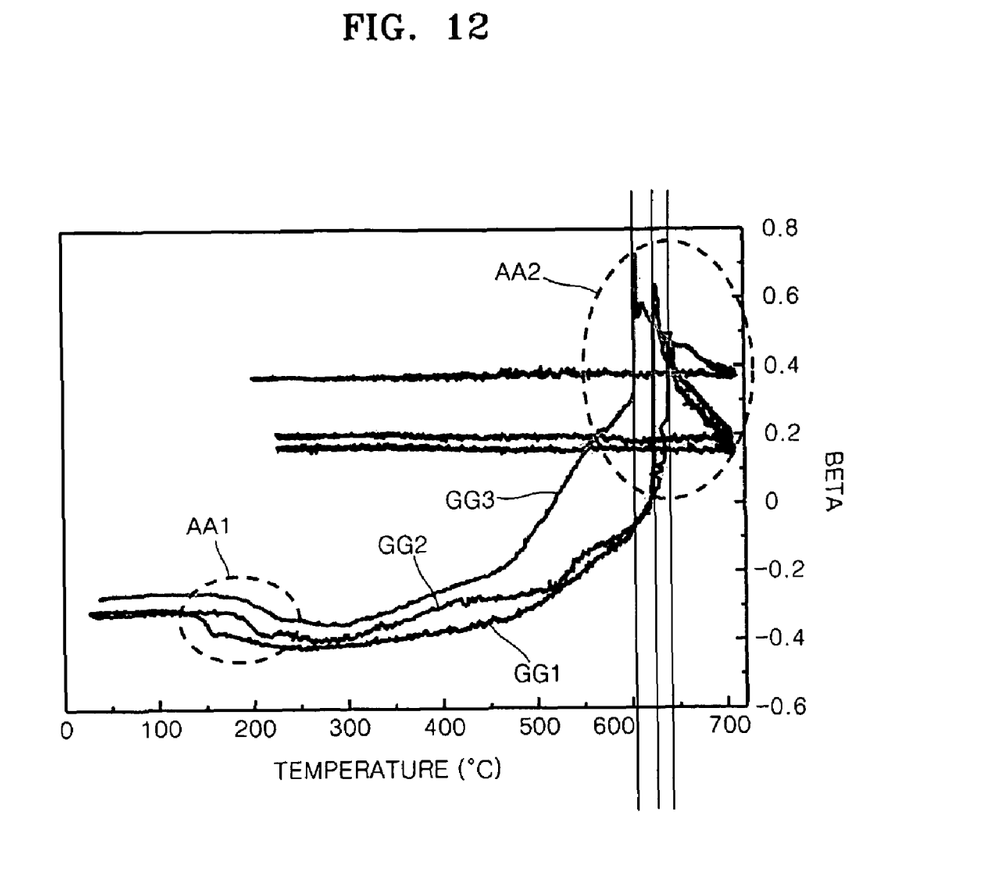

The measured results are illustrated in FIG. 12. In FIG. 12, a horizontal axis represents a temperature change and a vertical axis represents a β value change indicating a phase change of the phase change layer. In FIG. 12, first, second and third graphs GG1, GG2 and GG3 represent the measurement results for the first, second and third phase change layers, respectively.

Referring to FIG. 12, the first through third graphs GG1, GG2 and GG3 are firstly inflected at a first interval AA1 and thus the β value reduces. The reduction of the β value at the first interval AA1 means that the phases of the first through third phase change layers are changed from a crystalline state into an amorphous state. That is, the first through third phase change layers are crystallized at the first interval AA1. The crystallization temperatures of the first through third phase change layers are different from one another at the first interval AA1.

Specifically, the first and second phase change layers are crystallized at temperatures of about 150° C. and 180° C., respectively, and the third phase change layer is crystallized at a higher temperature than the second phase change layer. From the fact that the crystallization temperature increases from the first phase change layer to the third phase change layer, it can be seen that the crystallization temperature Tx of the phase change layer in PRAMs according to example embodiments increases as the insulating impurity content of the phase change layer increases. While the crystallization temperature of the phase change layer in the conventional PRAM is about 150° C., the crystallization temperatures of the first through third phase change layers are about 150-200° C. That is, phase change layer according to example embodiments has a higher crystallization temperate than the conventional phase change layer.

The first through third graphs GG1, GG2 and GG3 continue to increase from the first interval M1 and then secondly inflected at a second interval M2, which means that the β value decreases greatly. The β values decreases because the phases of the first through third phase change layers are changed from a crystalline state into an amorphous state. That is, the first through second phase change layers are melted and changed into an amorphous state at the second interval AA2. Like the crystallization temperature, the amorphorization temperatures of the first through third phase change layers varies according to the insulating impurity content of the phase change layer.

For example, in the second interval AA2, the first, second and third phase change layers are melted and changed into an amorphous state at temperatures of about 630° C., 640° C. and 600° C., respectively. This reveals that the amorphorization temperature Tm of phase change layer according to example embodiments decreases as the insulating impurity (e.g., $SiO_2$) content of the phase change layer increases. While the amorphorization temperature of the phase change layer in the conventional PRAM is about 630° C., the amorphorization temperatures of phase change layers in PRAMs according to example embodiments has a lower amorphorization temperature than the conventional phase change layer. Also, the results of FIG. 12 reveal that the amorphorization temperature of the phase change layer according to example embodiments may decrease below 600° C. according to the insulating impurity content of the phase change layer.

As can be seen from the above test results, the first and second PRAMs with a phase change layer containing the uniformly or substantially uniformly distributed insulating impurities have higher crystallization temperatures and lower amorphorization than the conventional PRAM. Accordingly, the first and second PRAMs may have lower reset current than the conventional PRAM. Because the first and second PRAMs have higher crystallization temperature than the conventional PRAM, the possibility of change of the data written at the reset current in the first and second PRAMs is lower than that in the conventional PRAM. That is, the first and second PRAMs may stably retain written data much longer than the conventional PRAM. This means that the first and second PRAMs have better retention characteristics than the conventional PRAM.

The lower electrode contact layer 58 of the first and second PRAMs may be formed of a material that has similar resistance, better Peltier effect and/or lower thermal conductivity than TiN or TiAlN used as the material of the lower electrode contact layer of the conventional PRAM.

When the reset current is applied to the phase change layer 60 of the first and second PRAMs, heat is generated at the partial region of the phase change layer 60. Due to this generated heat, the temperature of the partial region of the phase change layer 60 rapidly increases above the phase change temperature and thus the phase of the partial region is changed from a crystalline state into an amorphous state.

The entire heat generated at the partial region by the applied reset current is the sum of Joule heat, heat conduction loss, and heat generated due to the Peltier effect (hereinafter referred to as "Peltier heat").

Because the Peltier heat is generated due to the Peltier effect, the set resistance does not change according to the size change of the lower electrode contact layer 58. Accordingly, when the Peltier heat is increased, the entire heat generated at the partial region of the phase change layer 60 may be increased without consideration for an increase of the set resistance. This means that the reset current may be reduced to the extent corresponding to the increment of the entire heat due to the Peltier heat.

The lower electrode contact layer 58 may generate more Peltier heat than the conventional lower electrode contact layer formed of TiN or TiAlN. Therefore, the reset current of the first and second PRAMs may be reduced in relation to the increase in the Peltier heat. Because the size of the lower electrode contact layer 58 is not changed, the set resistance does not increase. Due to the lower electrode contact layer 58 and the phase change layer 60, the reset current of the first and second PRAMs may be further reduced.

The lower electrode contact layer 58 of the first and second PRAMs may be varied in shape. For example, the lower electrode contact layer 58 may be wide and flat, and the phase change layer 60 may be T-shaped, with a lower portion limited by the second interlayer insulating layer (refer to 66 in FIG. 13). For example, the contact surface between the lower electrode contact layer 58 and the phase change layer 60 may be defined by the interlayer insulating layer 66.

Figure 13:
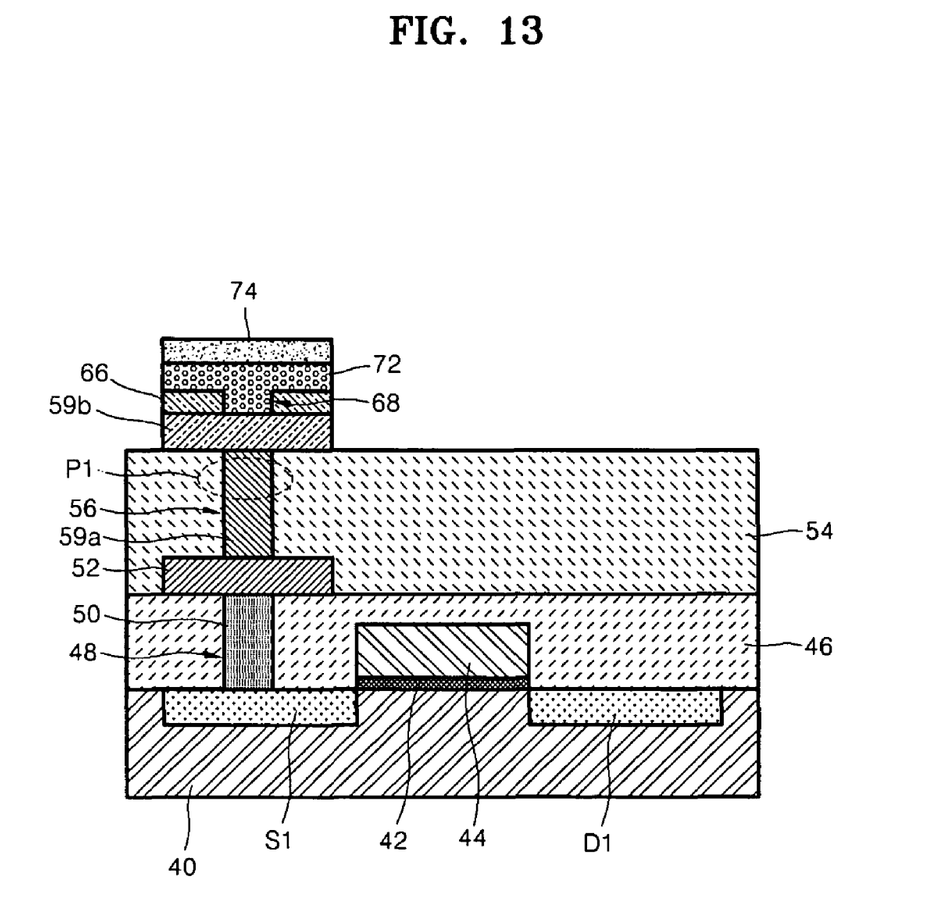
FIG. 13 is a sectional view illustrating a modification of the lower electrode contact layer of the PRAM in FIG. 1.

FIG. 13 is a sectional view illustrating a modification of the lower electrode contact layer of the PRAM in FIG. 1.

Referring to FIG. 13, a contact hole 56 formed in an insulating layer 54 may be filled with a first lower electrode contact layer 59a. A spacer may be further provided around the first lower electrode contact layer 59a. A second lower electrode contact layer 59b is formed on the insulating layer 54 to cover the exposed upper surface of the first lower electrode contact layer 59a. The first and second lower electrode contact layers 59a and 59b may be formed of, for example, the same material, or different materials. The material of the first and second lower electrode contact layers 59a and 59b may be identical to that of the lower electrode contact layer 58. The first and second lower electrode contact layers 59a and 59b may be formed simultaneously or sequentially.

An insulating layer 66 may be formed on the second lower electrode contact layer 59b. A contact hole 68 may be formed in the insulating layer 66 to expose a region of the second lower electrode contact layer 59b. A phase change layer 72 may be formed on the insulating layer 66 to fill the contact hole 68. The phase change layer 72 may be identical to or different from the phase change layer 60 of FIG. 1. An upper electrode 74 may be formed on the phase change layer 72.

A transistor in the PRAMs in FIGS. 1 and 4 is an example of a switching device. The transistor may be replaced by other switching devices, for example, a diode type switching device.

Figure 14:
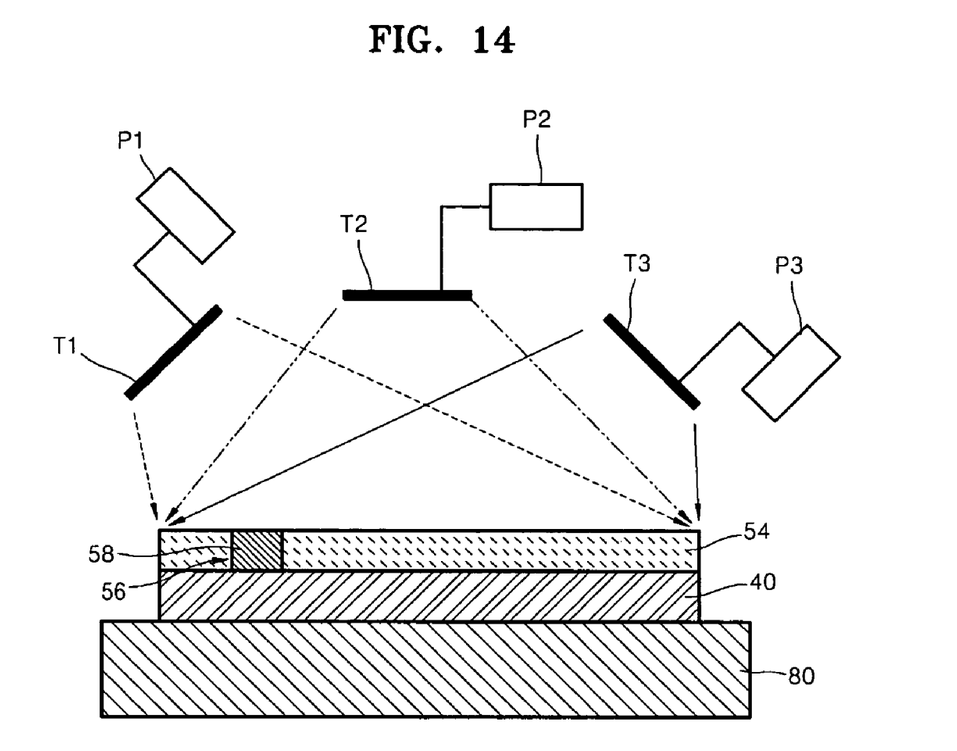
FIGS. 14 and 15 are sectional views illustrating a method of manufacturing a PRAM according to an example embodiment.
Figure 15:
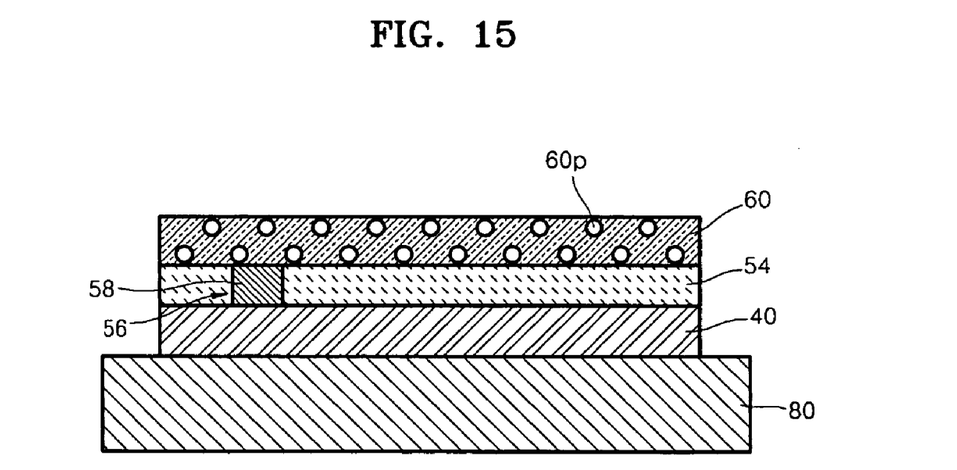

FIGS. 14 and 15 are sectional views illustrating a method of manufacturing a PRAM according to an example embodiment.

The interlayer insulating layer 54 of FIG. 1 and previous elements may be manufactured by a conventional process. A contact hole 56 may be formed in the interlayer insulating layer 54 and filled with a lower electrode contact layer 58. The lower electrode contact layer 58 may be formed in the structure illustrated in FIG. 2. The material characteristics of the lower electrode contact layer 58 may be the same as those in FIG. 2. Also, the lower electrode contact layer 58 may include the first and second lower electrode contact layer 59a and 59b, as illustrated in FIG. 13.

As illustrated in FIG. 14, the interlayer insulating layer 54 and the lower electrode contact layer 58 may be loaded on a susceptor 80 of sputtering deposition equipment.

First through third targets T1, T2 and T3 may be placed spaced apart from the upper surface of the interlayer insulating layer 54 by a predetermined or given distance. First through third power supply sources P1, P2 and P3 may be connected to the first through third targets T1, T2 and T3, respectively. The power from the first through third power supply sources P1, P2 and P3 may be adjusted. The first target T1 may be a target including some elements of GST, that is, GeTe. The second target T2 may be formed of an insulating material selected from the group consisting of $SiO_x$ (x=1~4), SiN, $Si_3N_4$, $TiO_x$ (x=1~4), AlO, and $Al_2O_3$, for example, $SiO_2$ or $SiO_4$. The third target T3 may be a target including the other elements of GST, that is, $Sb_2Te_3$.

The substrate 40 may be loaded on the susceptor 80. The power supplied to the first and third targets T1 and T3 may be constantly maintained and the power supplied to the second target T2 may be adjusted below 700 W, for example, a range of 30-500 W (for example, 60-300 W) according to the material of the second target T2.

In this state, sputtering gas collides with the first through third targets T1, T2 and T3 to generate plasma. In this manner, the materials of the first through third targets T1, T2 and T3 may be sputtered onto the substrate 40. The sputtered material on the substrate 40 may be a uniform mixture of the materials emitted from the first through third targets T1, T2 and T3. This mixed material may be deposited on the upper surfaces of the interlayer insulating layer 54 and the lower electrode contact layer 58 as illustrated in FIG. 15. This deposited material forms the phase change layer 60. Therefore, the phase change layer 60 may be formed to include the uniformly-distributed insulating impurities 60p. The content of the insulating impurities 60p in the phase change layer 60 may be increased or decreased by adjusting the power applied to the second target T2. For this purpose, a power adjuster may be further provided for the second power supply source P2.

After the formation of the phase change layer 60 on the interlayer insulating layer 54 and the lower electrode contact layer 58, an upper electrode may be formed by a conventional process.

A lower portion of the contact hole 56 may be filled with the lower electrode contact layer 58, and the remaining upper portion may be filled with the phase change layer 60.

A mask (not illustrated) may be formed on the interlayer insulating layer 54 to expose the upper surface of the lower electrode contact layer 58 and a partial upper surface of the interlayer insulating layer 54 around the upper surface of the lower electrode contact layer 58. Using the sputtering deposition equipment, the phase change layer 60 may be formed only on the region exposed by the mask. The phase change layer 60 may be formed to a thickness less than the target thickness of the phase change layer 60. Thereafter, the mask may be removed, and a sputtering deposition process may be performed after the power to the second target T2 is interrupted. As a result, the insulating impurities 60p may be uniformly distributed only over the partial region A1 of the phase change layer 60, as illustrated in FIG. 4.

Figure 16:
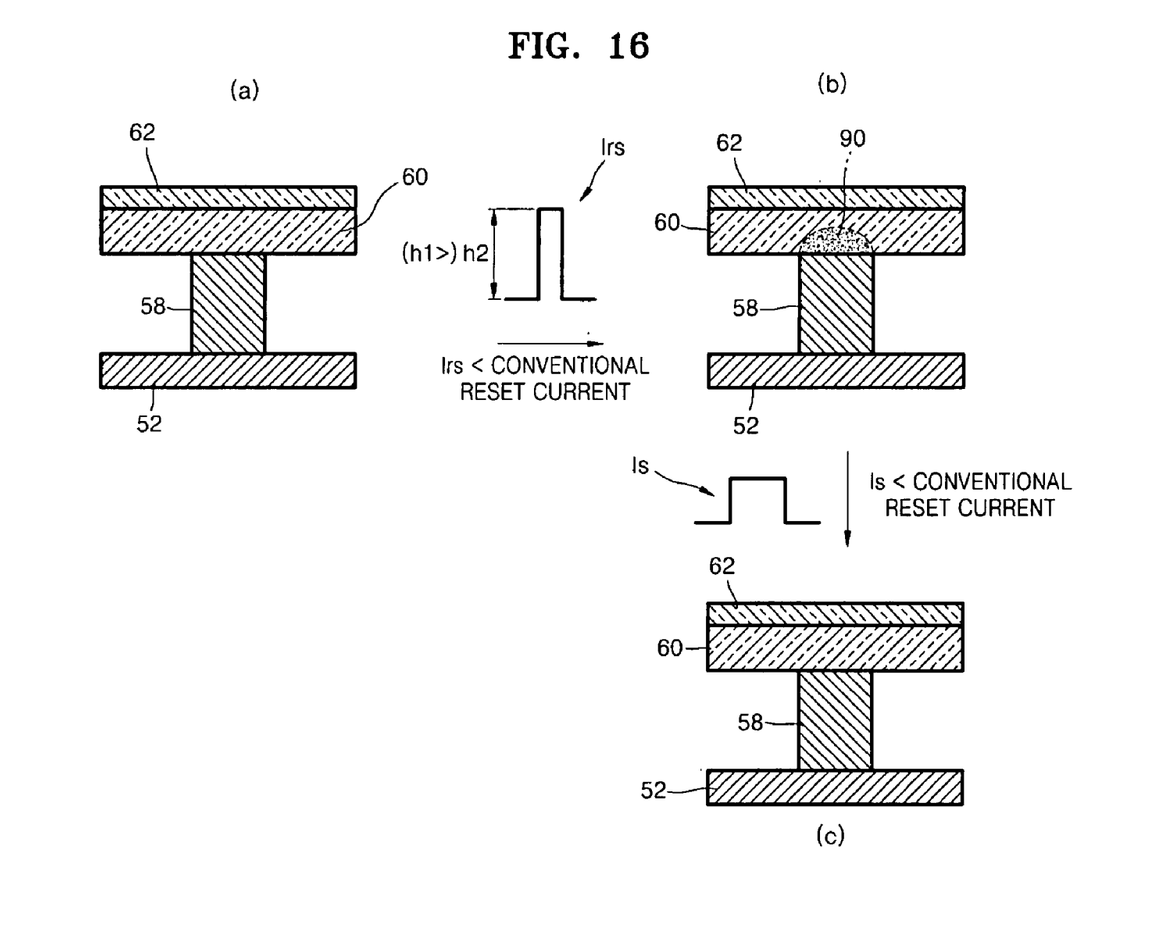
FIG. 16 is a sectional view illustrating a method of operating a PRAM according to an example embodiment.

FIG. 16 is a sectional view illustrating a method of operating a PRAM according to an example embodiment. The following operating method may be applied to any one of the first and second PRAMs. For convenience, the following description will be made with reference to FIG. 16.

The transistor is always turned on in this operation. Therefore, for convenience, the switching device and the uniformly-distributed insulating impurities in the phase change layer are not illustrated in FIG. 16.

Write Operation

As illustrated in FIG. 16A, a reset current Irs may be applied for a predetermined duration (e.g., a few nanoseconds) to the phase change layer 60 that is wholly crystallized. Because the lower electrode contact layer 58 generates greater Peltier heat than the conventional lower electrode contact layer, the reset current Irs may be smaller than the conventional reset current. For example, in the case of a 16 Mb PRAM, the conventional PRAM requires a reset current of 1.6 mA, but a PRAM according to example embodiments may require a reset current Irs of less than 1.6 mA. Additionally, in the case of a 64 Mb PRAM, the conventional PRAM requires a reset current of 1.1 mA, but a PRAM according to example embodiments may require a reset current Irs of less than 1.1 mA.

Because of the phase change layer 60 and the lower electrode contact layer 58, the reset current Irs of a PRAM according to example embodiments may be less than the conventional reset current.

Reference numeral h2 in FIG. 16 represents the height (or intensity) of the reset current Irs, which is lower than the height h1 of the conventional reset current.

When the reset current Irs is applied to the phase change layer 60, a temperature of a partial region of the phase change layer 60 contacting the lower electrode contact layer 58 increases suddenly to a temperature above the phase change temperature. As a result, an amorphous region 90 may be formed in the phase change layer 60 as illustrated (b) in FIG. 16. When the partial region of the phase change layer 90 becomes the amorphous region, the electrical resistance of the phase change layer 60 increases. In this case, it may be considered that bit data "1" is written in the first PRAM in FIG. 1.

When the partial region of the phase change layer 90 is a crystalline region, it is considered that bit data "0" is written in the first PRAM.

As illustrated (b) in FIG. 16, in the state where the phase change layer 60 has the amorphous region 90, a set current "Is" smaller than the reset current "Irs" is applied to the phase change layer 60. The set current "Is" may be applied for a longer duration than the reset current "Irs".

When this set current "Is" is applied, the amorphous region 90 of the phase change layer 60 becomes crystalline, and the phase change layer 60 becomes entirely crystalline, as illustrated (c) in FIG. 16. The states of the phase change layer 60 in FIGS. 16A and 16C are the same. Accordingly, applying the set current "Is" on the phase change layer 60 as shown (b)

in FIG. 16 may be regarded as erasing the bit data "1" written on the phase change layer 60 or writing the bit data "0" on the phase change layer 60.

Read Operation

In a read operation, when a current with such an intensity as not to change the phase of the phase change layer 60 is applied to the phase change layer 60, the measured resistance may be checked to determine whether the bit data written on the phase change layer 60 is 1 or 0. Accordingly, during the read operation, the current applied to the phase change layer 60 may be lower than the reset current "Irs" and the set current "Is".

It will be understood by those of ordinary skill in the art that the lower electrode contact layer 58 may be formed using a material layer having a larger Peltier effect than the above-described material layer. Also, the phase change layer 60 may be any material layer other than a GST layer. Furthermore, an operating method applying the reset current and the set current in an opposite direction may be pursued. Therefore, example embodiments are not limited by the description herein, but should be defined by the accompanying claims.

As described above, PRAMs according to example embodiments include insulating impurities that are uniformly distributed in the phase change layer. Due to the uniformly-distributed insulating impurities, the amorphization temperature Tm decreases and the crystallization temperature Tx increases. As a result, the reset current of PRAMs according to example embodiments decreases and thus the size of the transistor may be reduced in accordance with the decreased reset current. Also, due to the increase of the crystallization temperature, the retention characteristics of PRAMs according to example embodiments may be improved.

In addition, PRAMs according to example embodiments may use a given material layer as the lower electrode contact layer 58 that contacts the lower surface of the phase change layer 60. When compared to the conventional TiAlN, the given material layer has a negative Seebeck coefficient with a larger absolute value, a lower thermal conductivity, and/or a similar electrical resistance. Because the given material layer has a high Seebeck coefficient, it may generate larger Peltier heat than the conventional material layer.

Accordingly, the reset current may be reduced due to the phase change layer 60. In addition, the reset current may be further reduced as a function of the increase in the Peltier heat. This makes it possible to reduce the maximum allowable current of the transistor. Consequently, the transistor may be reduced in size over the conventional transistor, resulting in the increase of the integration level of PRAMs according to example embodiments.

The reduction of the reset current due to the Peltier effect is irrelevant to the reduction of the size of the lower electrode contact layer 58. Accordingly, the integration level of PRAMs according to example embodiments may be increased without an increase in the set resistance.

While example embodiments have been shown and described with reference to the accompanying figures, it will be understood by those of ordinary skill in the art that various changes in form and details may be made therein without departing from the spirit and scope of example embodiments, as defined by the following claims.

What is claimed is:

1. A phase changing material, comprising:
    a first material having a crystallization temperature and an amorphization temperature, different from each other, wherein a phase of the first material is capable of changing from an amorphous phase to a crystalline phase and from the crystalline phase to the amorphous phase, and the first material is $Ge_2Sb_2Te_5$; and
    insulating impurities uniformly distributed over the first material, wherein the insulating impurities decrease the amorphization temperature of the first material and increase the crystallization temperature of the first material, and the insulating impurities are located at vacancies or interstitial sites in the first material, and at least one selected from the group consisting of $SiO_x$ (x=1~4), $TiO_x$ (x=1~4), AlO and $Al_2O_3$.

2. The phase changing material of claim 1, wherein the insulating impurities are uniformly distributed over an entire region of the first material or only over a partial region of the first material.

3. The phase changing material of claim 1, wherein a content of the insulating impurities is 0.1 to 10% (inclusive) of a volume of the first material.

4. A PRAM (phase change random access memory) comprising:
    a switching device;
    a lower electrode connected to the switching device;
    a lower electrode contact layer formed on the lower electrode;
    a phase change layer formed of the phase changing material of claim 1 and formed on the lower electrode contact layer, a partial region of a lower surface of the phase change layer contacting an upper surface of the lower electrode contact layer; and
    an upper electrode formed on the phase change layer,
    wherein the phase change layer includes uniformly-distributed insulating impurities.

5. The PRAM of claim 4, wherein the insulating impurities are uniformly distributed over an entire region of the phase change layer.

6. The PRAM of claim 4, wherein the insulating impurities are uniformly distributed only over a partial region of the phase change layer where a phase change occurs.

7. The PRAM of claim 4, wherein a content of the insulating impurities is 0.1 to 10% (inclusive) of a volume of the phase change layer.

8. The PRAM of claim 4, wherein the lower electrode contact layer is formed of TiN, TiAlN, or a material that has a negative Seebeck coefficient with a larger absolute value than TiN or TiAlN, a lower thermal conductivity than TiN or TiAlN, and the same level of electrical resistance as TiN or TiAlN.

9. The PRAM of claim 4, wherein the lower electrode contact layer is filled in a portion of a contact hole, and the phase change layer is filled in a remaining portion of the contact hole.

10. A PRAM (phase change random access memory) comprising:
    a switching device;
    a lower electrode connected to the switching device;
    an interlayer insulating layer covering the switching device and the lower electrode;
    a first contact hole formed in the interlayer insulating layer to expose the lower electrode;
    a first lower electrode contact layer filling the first contact hole;
    a second lower electrode contact layer formed on the interlayer insulating layer to cover the first lower electrode contact layer;
    an insulating layer formed on the second lower electrode contact layer, the insulating layer including a second contact hole formed therein to expose the second lower electrode contact layer;

a phase change layer formed of the phase changing material of claim 1 and formed on an upper surface of the insulating layer to fill the second contact hole; and an upper electrode formed on the phase change layer, wherein the phase change layer includes uniformly-distributed insulating impurities.

11. The PRAM of claim 10, wherein the insulating impurities are uniformly distributed over an entire region of the phase change layer.

12. The PRAM of claim 10, wherein the insulating impurities are uniformly distributed only over a partial region of the phase change layer contacting the lower electrode contact layer.

13. The PRAM of claim 10, wherein the content of the insulating impurities is 0.1 to 10% (inclusive) the volume of the phase change layer.

14. The PRAM of claim 10, wherein the first and second lower electrode contact layers are formed of TiN, TiAlN, or a material that has a negative Seebeck coefficient with a larger absolute value than TiN or TiAlN, a lower thermal conductivity than TiN or TiAlN, and the same level of electrical resistance as TiN or TiAlN.

* * * * *